(12) United States Patent
Xie et al.

(10) Patent No.: US 10,388,665 B1
(45) Date of Patent: *Aug. 20, 2019

(54) METHODS OF FORMING AN ARRAY OF ELEVATIONALLY-EXTENDING STRINGS OF MEMORY CELLS HAVING A STACK COMPRISING VERTICALLY-ALTERNATING INSULATIVE TIERS AND WORDLINE TIERS AND HORIZONTALLY-ELONGATED TRENCHES IN THE STACK

(71) Applicant: Micron Technology, Inc., Boise, ID (US)

(72) Inventors: Zhiqiang Xie, Meridian, ID (US); Chris M. Carlson, Nampa, ID (US); Justin B. Dorhout, Boise, ID (US); Anish A. Khandekar, Boise, ID (US); Greg Light, Meridian, ID (US); Ryan Meyer, Boise, ID (US); Kunal R. Parekh, Boise, ID (US); Dimitrios Pavlopoulos, Glendale, CA (US); Kunal Shrotri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/992,959

(22) Filed: May 30, 2018

(51) Int. Cl.
*H01L 27/11582* (2017.01)
*H01L 21/02* (2006.01)
(Continued)

(52) U.S. Cl.
CPC .... *H01L 27/11582* (2013.01); *H01L 21/0228* (2013.01); *H01L 21/02164* (2013.01);
(Continued)

(58) Field of Classification Search
CPC .................................................. H01L 27/11582
See application file for complete search history.

(56) References Cited

U.S. PATENT DOCUMENTS

| 10,236,301 | B1* | 3/2019 | Howder | ............ | H01L 27/11582 |
| 2014/0014889 | A1 | 1/2014 | Shim et al. | | |

(Continued)

OTHER PUBLICATIONS

U.S. Appl. No. 15/890,503, filed Feb. 7, 2018, by Howder et al.

*Primary Examiner* — Quoc D Hoang
(74) *Attorney, Agent, or Firm* — Wells St. John P.S.

(57) ABSTRACT

An array of elevationally-extending strings of memory cells comprises a vertical stack of alternating insulative tiers and wordline tiers. The wordline tiers have terminal ends corresponding to control-gate regions of individual memory cells. The control-gate regions individually comprise part of a wordline in individual of the wordline tiers. A charge-blocking region of the individual memory cells extends elevationally along the individual control-gate regions. Charge-storage material of the individual memory cells extends elevationally along individual of the charge-blocking regions. Channel material extends elevationally along the vertical stack. Insulative charge-passage material is laterally between the channel material and the charge-storage material. Elevationally-extending walls laterally separate immediately-laterally-adjacent of the wordlines. The walls comprise laterally-outer insulative material and silicon-containing material spanning laterally between the laterally-outer insulative material. The silicon-containing material comprises at least 30 atomic percent of at least one of elemental-form silicon or a silicon-containing alloy. Other aspects, including method, are also disclosed.

22 Claims, 15 Drawing Sheets

(51) Int. Cl.
*H01L 27/11556* (2017.01)
*H01L 21/28* (2006.01)
H01L 21/3213 (2006.01)
H01L 27/11519 (2017.01)
H01L 27/11565 (2017.01)
H01L 21/311 (2006.01)

(52) U.S. Cl.
CPC .. *H01L 21/02271* (2013.01); *H01L 21/02532* (2013.01); *H01L 21/02592* (2013.01); *H01L 21/02595* (2013.01); *H01L 21/28273* (2013.01); *H01L 21/28282* (2013.01); *H01L 27/11556* (2013.01); H01L 21/0214 (2013.01); H01L 21/0217 (2013.01); H01L 21/02178 (2013.01); H01L 21/02181 (2013.01); H01L 21/31111 (2013.01); H01L 21/32133 (2013.01); H01L 27/11519 (2013.01); H01L 27/11565 (2013.01)

(56) References Cited

U.S. PATENT DOCUMENTS

| | | |
|---|---|---|
| 2015/0318301 A1 | 11/2015 | Lee et al. |
| 2016/0268302 A1 | 9/2016 | Lee et al. |
| 2017/0207226 A1 | 7/2017 | Lee |
| 2017/0278859 A1* | 9/2017 | Sharangpani ..... H01L 27/11573 |

* cited by examiner

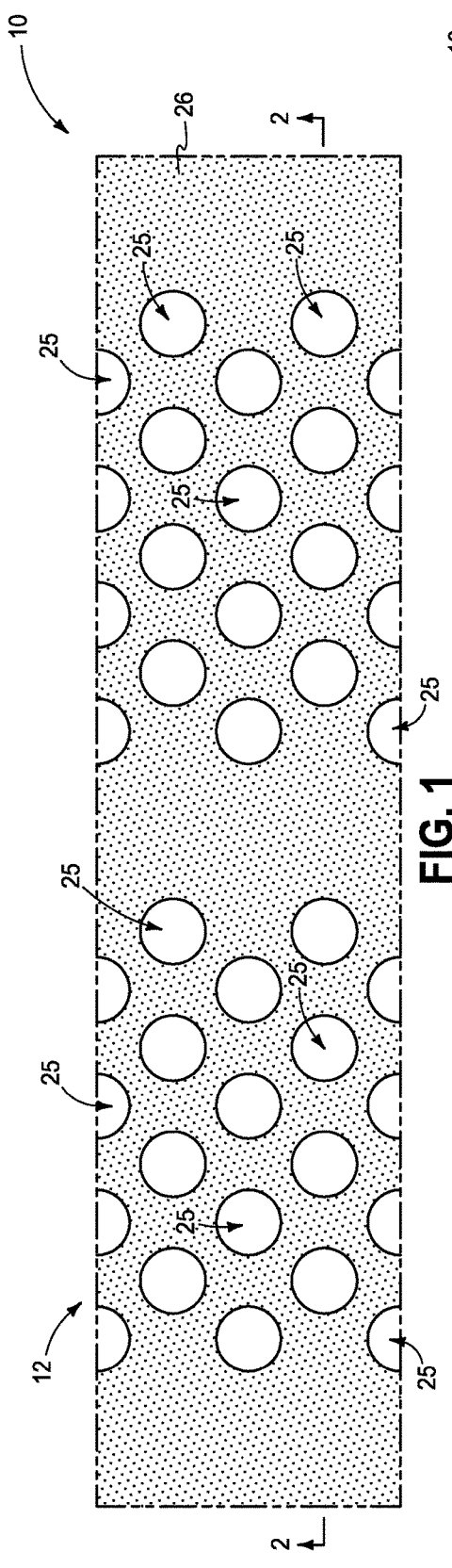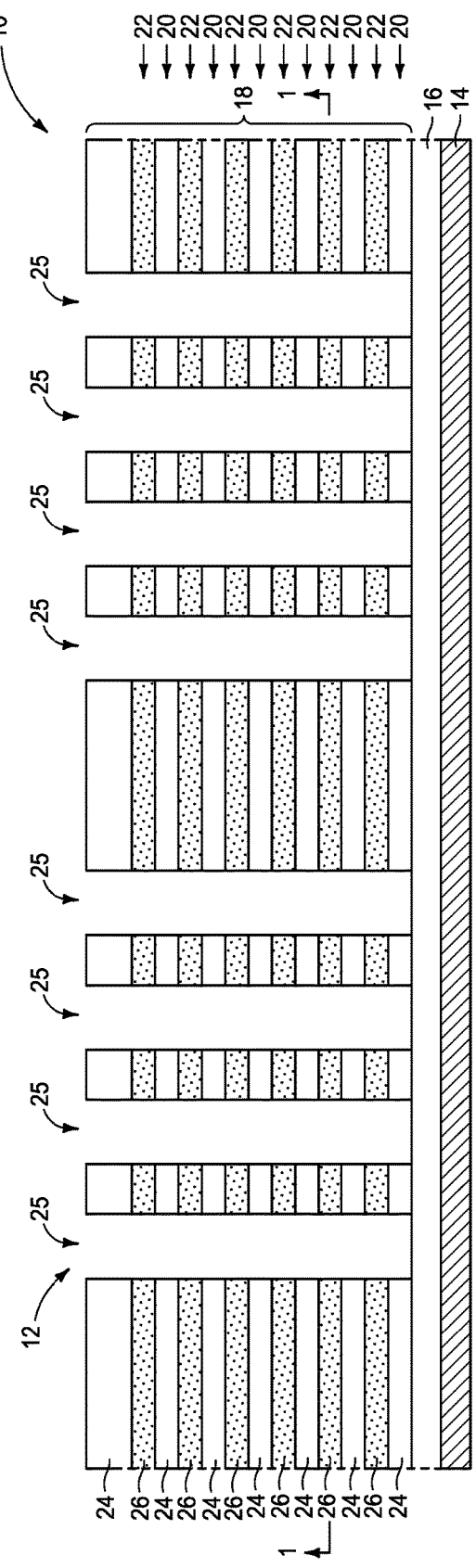

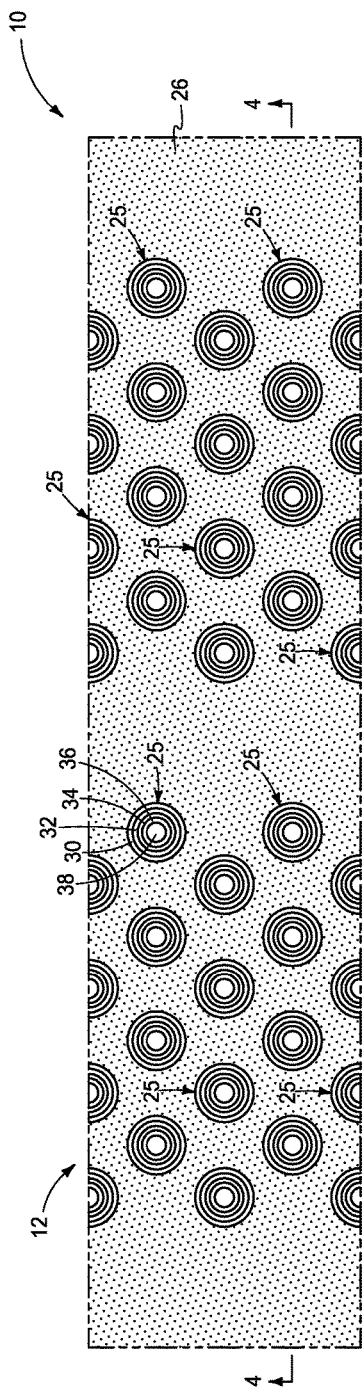
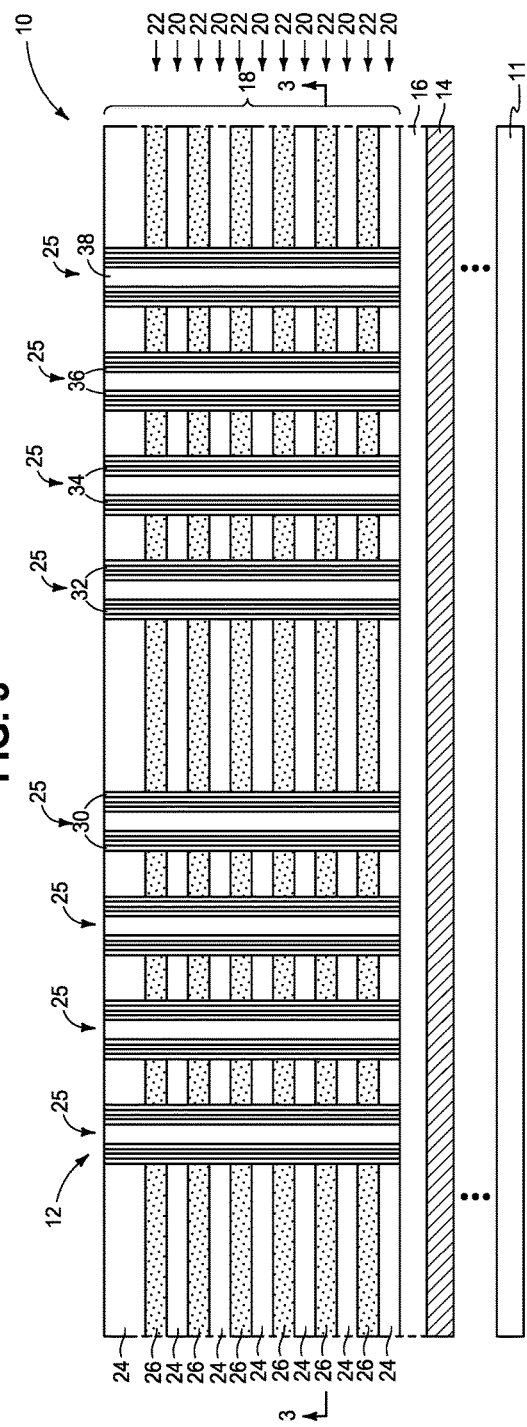
FIG. 3
FIG. 4

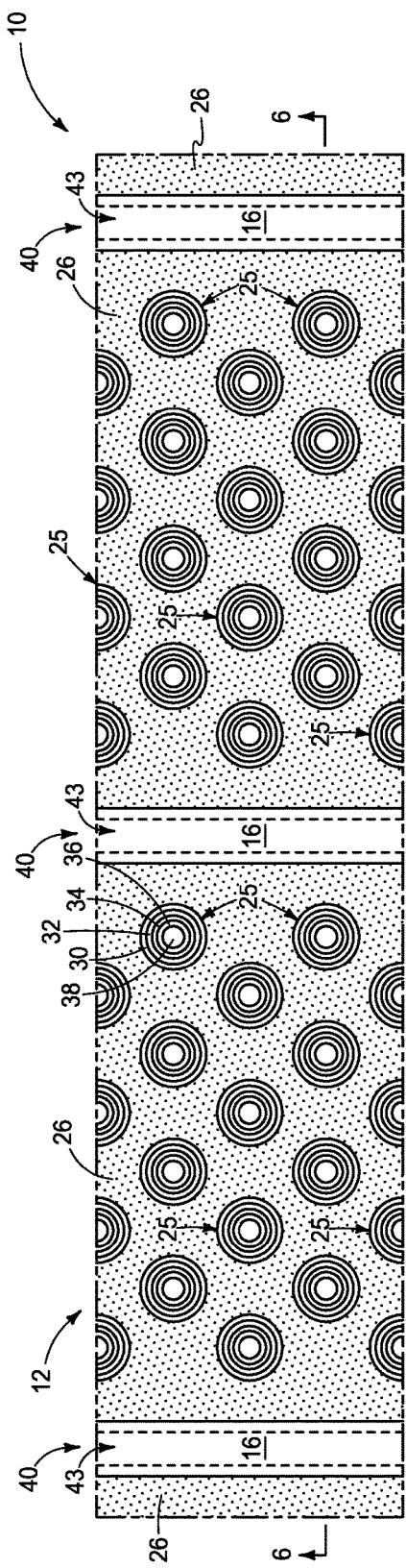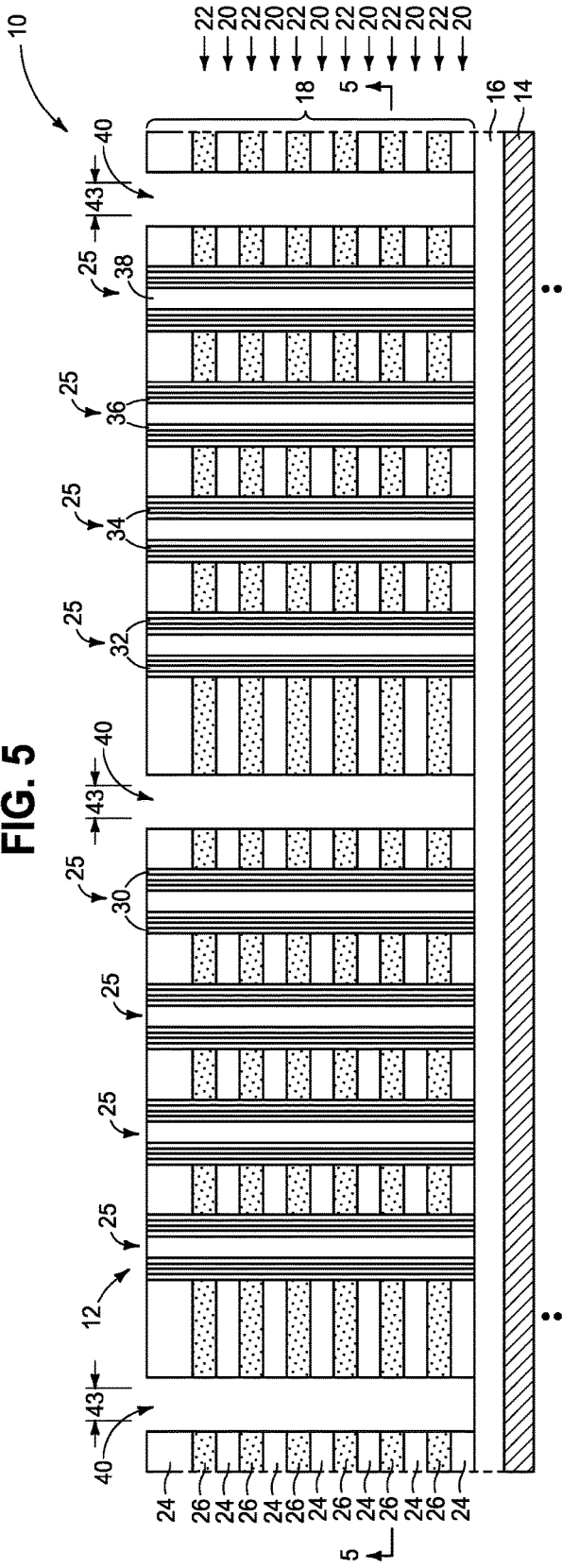

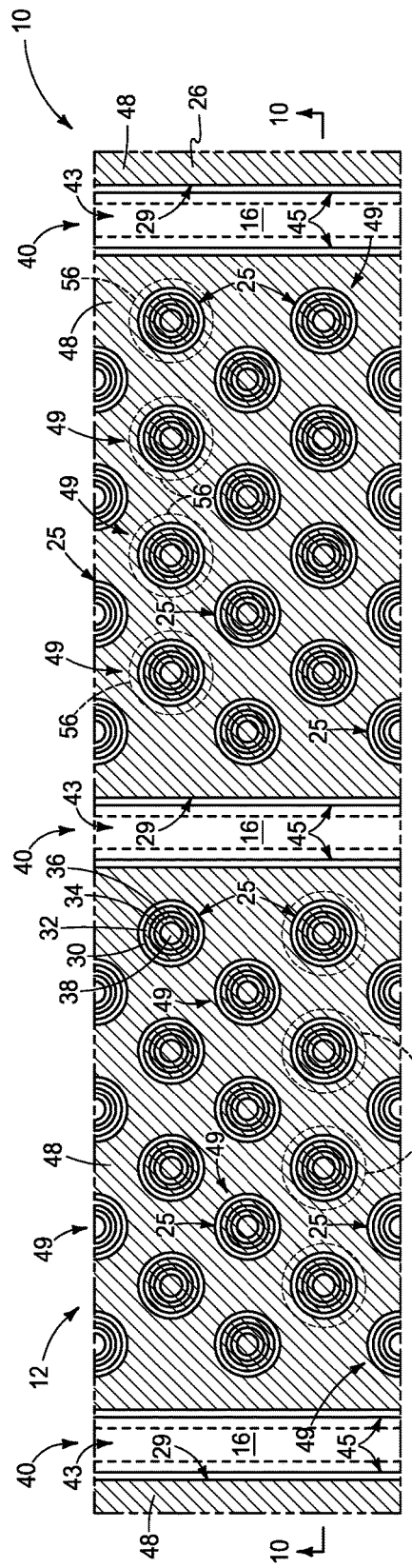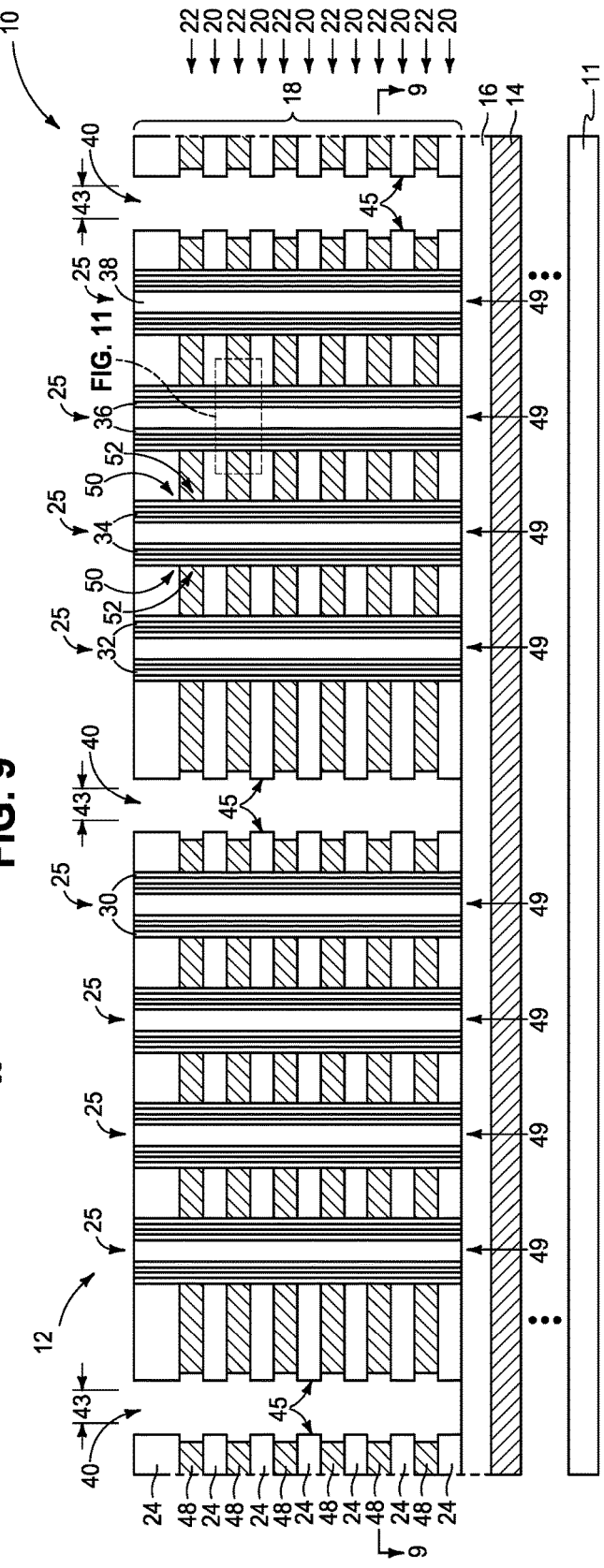
FIG. 9
FIG. 10
FIG. 11

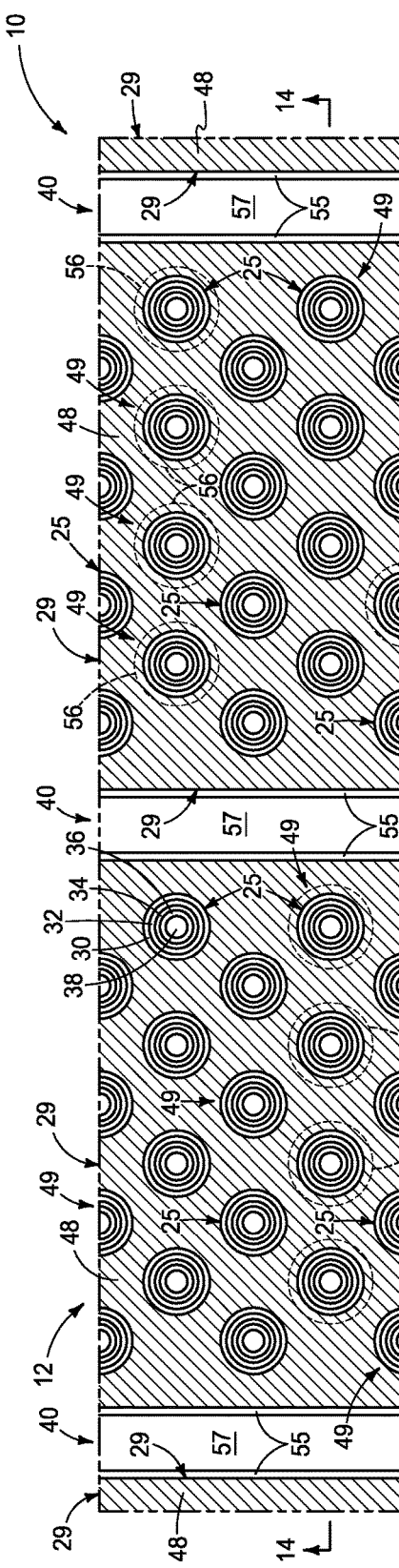
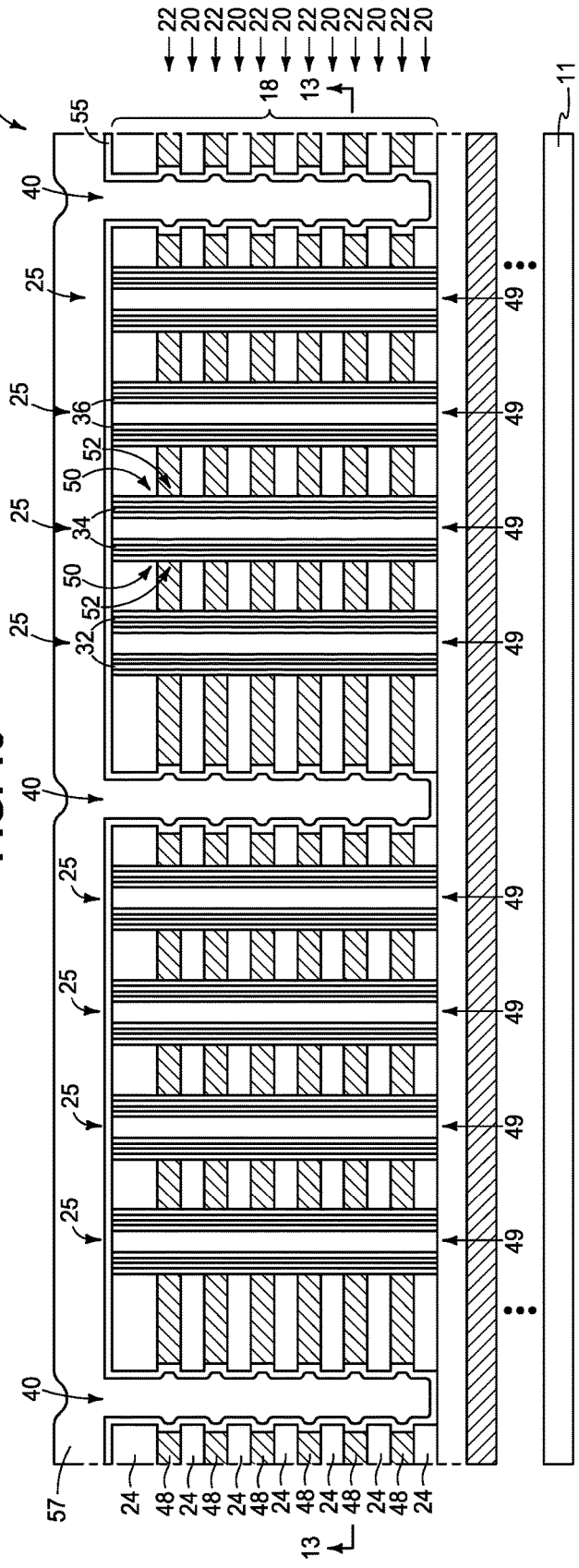
FIG. 13
FIG. 14 dent of the inventive aspects disclosed herein. The invention also encompasses structure independent of method of manufacture.

METHODS OF FORMING AN ARRAY OF ELEVATIONALLY-EXTENDING STRINGS OF MEMORY CELLS HAVING A STACK COMPRISING VERTICALLY-ALTERNATING INSULATIVE TIERS AND WORDLINE TIERS AND HORIZONTALLY-ELONGATED TRENCHES IN THE STACK

TECHNICAL FIELD

Embodiments disclosed herein pertain to arrays of elevationally-extending strings of memory cells and to methods of forming an array of elevationally-extending strings of memory cells BACKGROUND Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a view taken through line 2-2 in FIG. 1.

FIG. 3 is a view of the FIG. 1 substrate at a processing step subsequent to that shown by FIG. 1 and is taken through line 3-3 in FIG. 4.

FIG. 4 is a view taken through line 4-4 in FIG. 3.

FIG. 5 is a view of the FIG. 3 substrate at a processing step subsequent to that shown by FIG. 3 and is taken through line 5-5 in FIG. 6.

FIG. 6 is a view taken through line 6-6 in FIG. 5.

FIG. 9 is a view of the FIG. 8 substrate at a processing step subsequent to that shown by FIG. 8 and is taken through line 9-9 in FIG. 10.

FIG. 10 is a view taken through line 10-10 in FIG. 9.

FIG. 13 is a view of the FIG. 12 substrate at a processing step subsequent to that shown by FIG. 12 and is taken through line 13-13 in FIG. 14.

FIG. 14 is a view taken through line 14-14 in FIG. 13.

DETAILED DESCRIPTION OF EXAMPLE EMBODIMENTS

Figure 7:
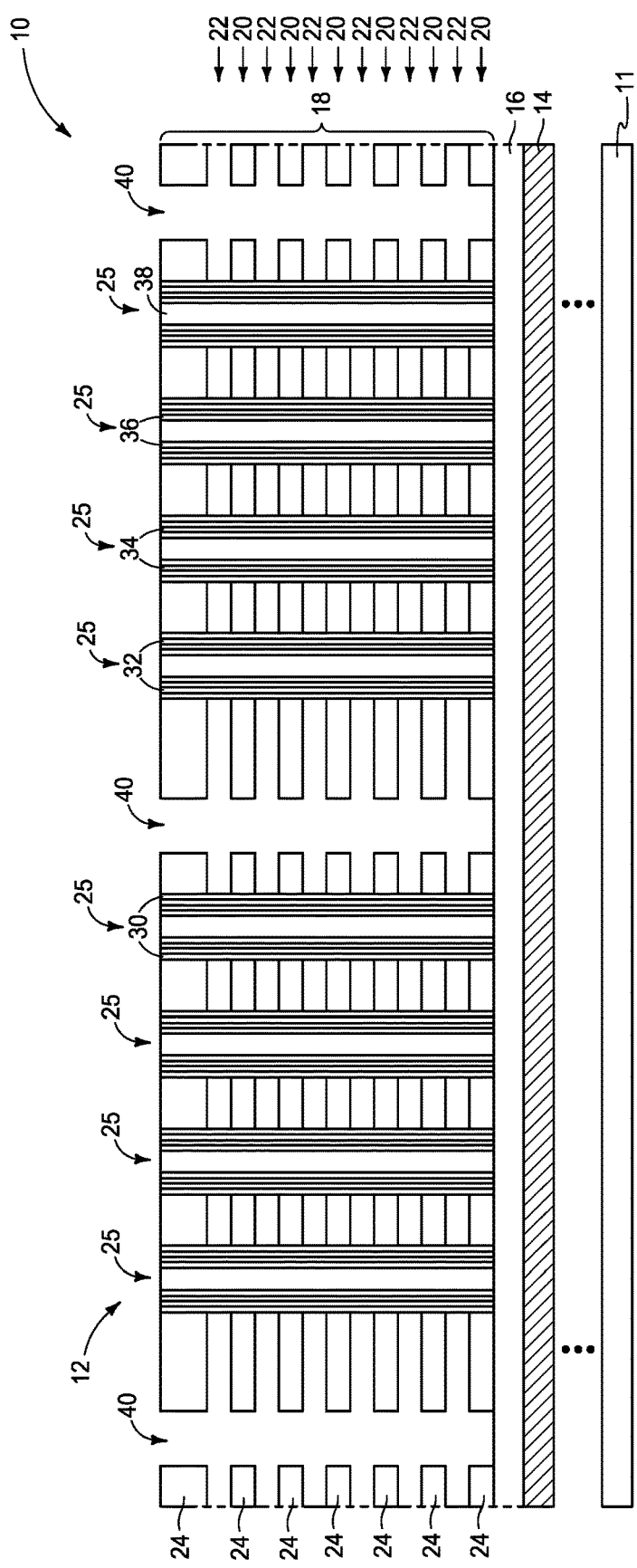
FIG. 7 is a view of the FIG. 5 substrate at a processing step subsequent to that shown by FIG. 5.

Embodiments of the invention encompass methods of forming an array of elevationally-extending strings of memory cells, for example an array of NAND or other memory cells having its peripheral control circuitry under the array (e.g., CMOS under-array). Embodiments of the invention encompass so-called "gate-last" or "replacement-gate" processing, so-called "gate-first" processing, and other processing whether existing or yet-to-be-developed independent of when transistor gates are formed. First example embodiments are described with reference to FIGS. 1-15 which may be considered as a "gate-last" or "replacement-gate" process.

FIGS. 1 and 2 show a substrate construction 10 in process of a method of forming an array 12 of elevationally-extending strings of memory cells. Substrate construction 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

In some embodiments, conductively-doped semiconductor material 16 has been formed directly above and electrically coupled to a metal material 14. In one embodiment and as shown, conductively-doped semiconductor material 16 and metal material 14 are directly against and directly electrically coupled to one another. In one embodiment, conductively-doped semiconductor material 16 comprises, consists essentially of, or consists of conductively-doped polysilicon, and in one embodiment metal material 14 comprises, consists essentially of, or consists of a silicide, such as tungsten silicide. Conductive material 16, 14 may comprise a part of control circuitry (e.g., peripheral-under-array circuitry) used to control read and write access to the memory cells that will be formed within array 12. Example thicknesses for materials 16 and 14 are 500 Angstroms and 900 Angstroms, respectively.

A stack 18 comprising vertically-alternating insulative tiers 20 and wordline tiers 22 has been formed directly above conductively-doped semiconductor material 16. Insulative tiers 20 comprise insulative first material 24 (e.g., silicon dioxide). Wordline tiers 22 comprise second material 26 that is of different composition from of that of first material 24 (e.g., silicon nitride, and regardless which may be wholly or partially sacrificial). Elevationally-extending channel openings 25 have been formed into alternating tiers 20, 22. By way of example only, such are shown as being arranged in groups or columns of staggered rows of four openings 25 per row. Any alternate existing or yet-to-be-developed arrangement and construction may be used. Use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles. Other circuitry that may or may not be part of peripheral circuitry may be between conductively-doped semiconductor material 16 and stack 18.

Referring to FIGS. 3 and 4, charge-blocking material 30 (i.e., a charge block) has been formed in channel openings 25 elevationally along alternating tiers 20, 22. Material 30 may be a composite of different composition layers, for example silicon dioxide-silicon nitride-silicon dioxide. Charge-storage material 32 has been formed in channel openings 25 elevationally along alternating tiers 20, 22 and charge-blocking material 30. Charge-storage material 32 may comprise any suitable composition(s) and, in some embodiment, may comprise floating gate material (e.g., doped or undoped silicon) or charge-trapping material (e.g., silicon nitride, metal dots, etc.). Insulative charge-passage material 34 has been formed in channel openings 25 elevationally along alternating tiers 20, 22 and insulative charge-storage material 32. Charge-passage material 34 may be, by way of example, a bandgap-engineered structure having nitrogen-containing material (e.g., silicon nitride) sandwiched between two insulator oxides (e.g., silicon dioxide). Transistor channel material 36 has been formed in channel openings 25 elevationally along alternating tiers 20, 22 and insulative charge-passage material 34. Example channel materials 36 include appropriately-doped crystalline semiconductor material, such as one or more of silicon, germanium, and so-called III/V semiconductor materials (e.g., GaAs, InP, GaP, and GaN). Example thicknesses for each of materials 30, 32, 34, and 36 is 25 to 100 Angstroms. Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and and/or be devoid of solid material (not shown).

Referring to FIGS. 5 and 6, horizontally-elongated (FIG. 5) trenches 40 have been formed (e.g., by anisotropic etching) into stack 18 and in one embodiment to conductively-doped semiconductor material 16 (i.e., at least to material 16). Trenches 40 may be considered as individually having a lateral mid-portion 43. Lateral edges of trenches 40 may at least in part be used to define lateral edges of wordlines (e.g., access or control-gate lines, and not shown in FIGS. 5 and 6) to be formed subsequently. Regardless, and in one embodiment and as shown, channel openings 25 are formed and transistor channel material 36 is provided therein before forming trenches 40.

Referring to FIG. 7, second material 26 (not shown) of wordline tiers 22 has been etched selectively relative to insulative first material 24. An example etching chemistry, where second material 26 comprises silicon nitride and first material 24 comprises an insulative oxide (e.g., silicon dioxide), is liquid or vapor etching with $H_3PO_4$ as a primary etchant.

Figure 8:
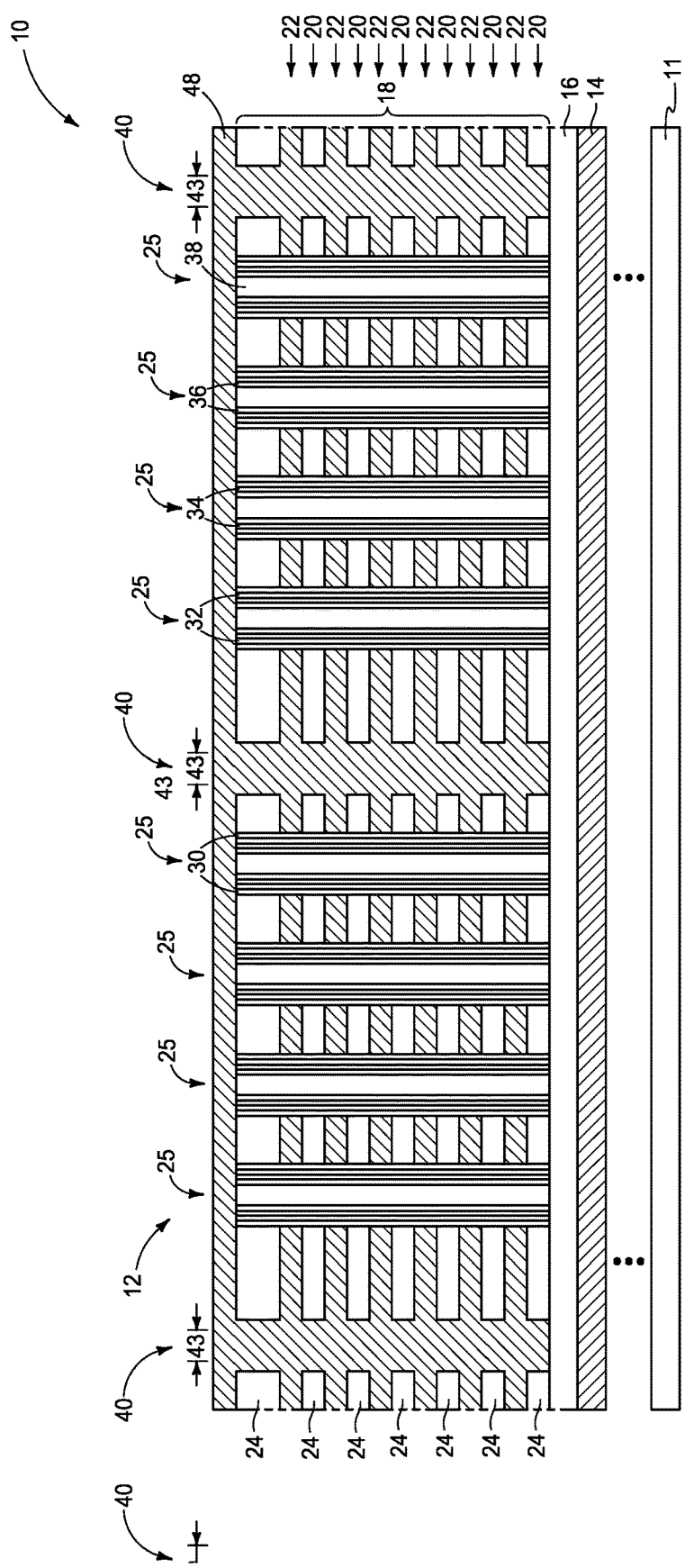
FIG. 8 is a view of the FIG. 7 substrate at a processing step subsequent to that shown by FIG. 7.

Referring to FIG. 8 control-gate material 48 (i.e., conductive material) has been formed into wordline tiers 22 through trenches 40 to be elevationally between insulative first material 24 of alternating tiers 20, 22 and to be in lateral mid-portion 43 of individual of trenches 40. Any suitable conductive material may be used, for example one or both of metal material and/or conductively-doped semiconductor material.

Figure 11:
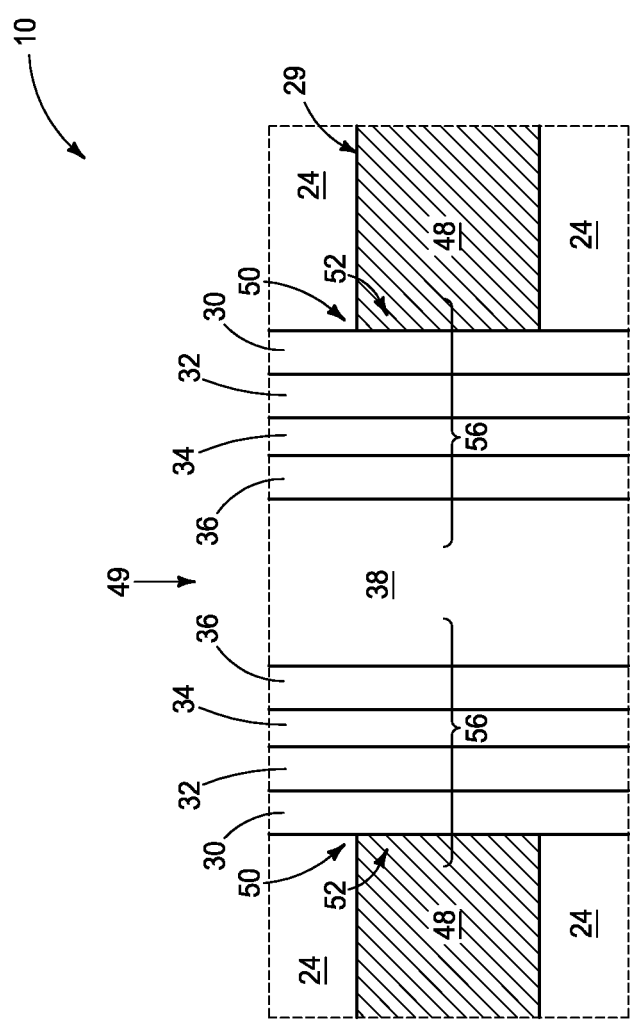
FIG. 11 is an enlarged view of a portion of the substrate as shown in FIG. 10.

Referring to FIGS. 9-11, control-gate material 48 has been removed from lateral mid-portions 43 of trenches 40, and in one embodiment as shown has also been laterally-recessed back from radially-innermost sidewalls 45 of trenches 40, for example by selective wet or dry etching. Such has resulted in formation of wordlines 29 and elevationally-extending strings 49 of individual memory cells 56. In one embodiment and as shown, strings 49 are formed to be vertical or within 100 of vertical. Approximate locations of memory cells 56 are indicated with brackets in FIG. 11 and with dashed outlines in FIG. 9, with memory cells 56 being essentially ring-like or annular in the depicted example. Control-gate material 48 has terminal ends 50 corresponding to control-gate regions 52 of individual memory cells 56. Control-gate regions 52 in the depicted embodiment comprise individual portions of individual wordlines 29.

A charge-blocking region (e.g., charge-blocking material 30) is between charge-storage material 32 and individual of control-gate regions 52. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 30. By way of further examples, a charge-blocking region may comprise a laterally (e.g., radially) outer portion of the charge-storage material (e.g., material 32) where such charge-storage material is insulative (e.g., in the absence of any different-composition material between an insulative charge-storage material 32 and conductive material 48). Regardless, as an additional example, an interface of a charge-storage material and conductive material of a control gate may be sufficient to function as a charge-blocking region in the absence of any separate-composition-insulator material 30. Further, an interface of conductive material 48 with material 30 (when present) in combination with insulator material 30 may together function as a charge-blocking region, and as alternately or additionally may a laterally-outer region of an insulative charge-storage material (e.g., a silicon nitride material 32).

Figure 12:
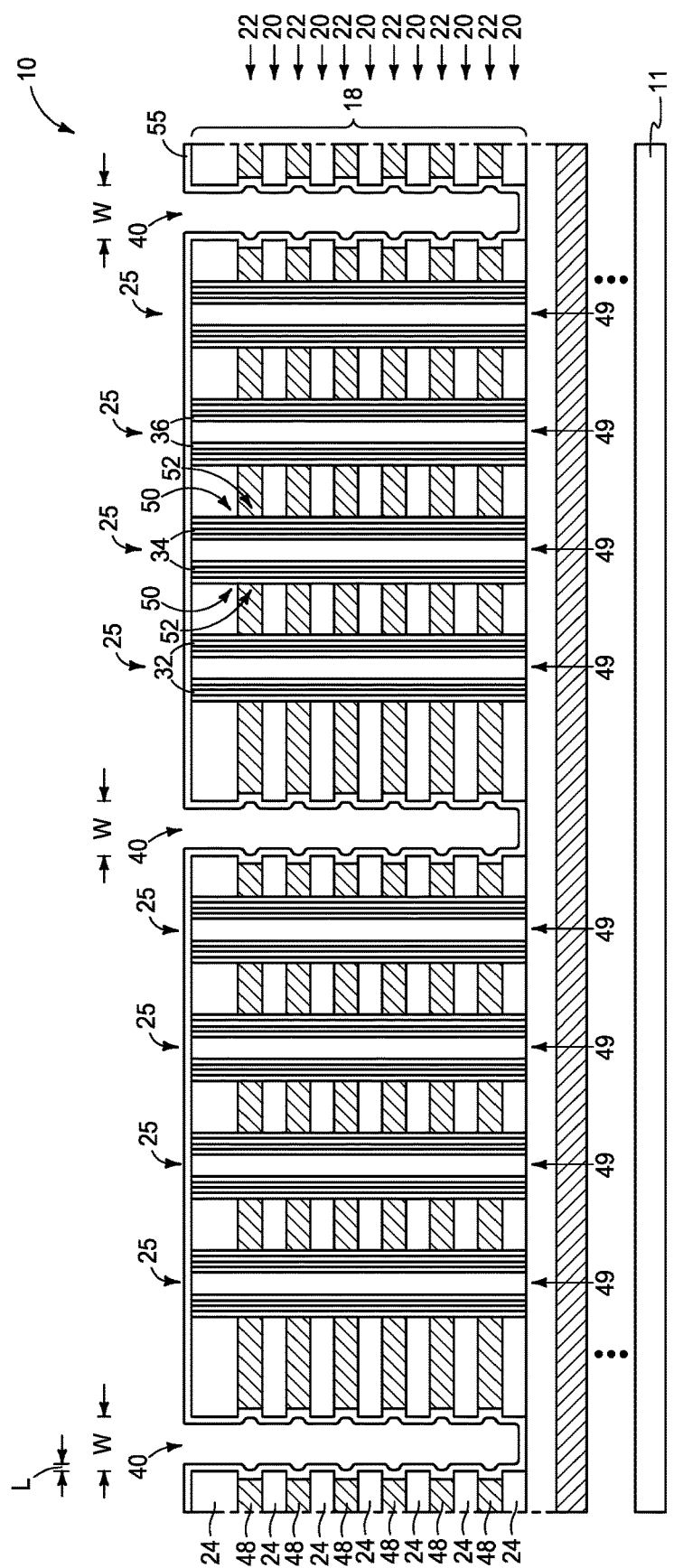
FIG. 12 is a view of the FIG. 10 substrate at a processing step subsequent to that shown by FIG. 10.

Referring to FIG. 12, an insulative-material lining 55 has been formed in individual trenches 40 over and elevationally along sidewalls 45 of individual trenches 40, and in one embodiment directly above the top of stack 18. In one embodiment, the insulative material of lining 55 predominately (i.e., more than 50% up to and including 100%) comprises $SiO_2$. In one embodiment, the insulative material of lining 55 comprises at least one of silicon nitride, silicon oxynitride, aluminum oxide, and hafnium oxide (including any combinations of two or more of such). In one embodiment, insulative material of lining 55 is ferroelectric. In one embodiment, the forming of insulative-material lining 55 comprises atomic layer deposition (ALD), and in another embodiment comprises chemical vapor deposition (CVD). By way of examples only, ALD and CVD deposition conditions include a substrate temperature of 350° C. to 450° C., chamber pressure of 300 mTorr to 6 Torr, and using suitable deposition precursors.

In one embodiment, individual trenches 40 are formed to have an uppermost minimum lateral width W in a vertical cross-section, for example the vertical cross-section that is the plane of the page upon which FIG. 12 lies. Insulative-material lining 55 has a lateral width L of 2.5% to 20%, in one embodiment 5% to 12.5%, and in one embodiment about 10%, of uppermost minimum lateral width W in the vertical cross-section.

Referring to FIGS. 13 and 14, silicon-containing material 57 has been formed in individual trenches 40 elevationally along and spanning laterally between insulative-material lining 55. In one embodiment and as shown, silicon-containing material 57 is formed directly above the top of stack 18 directly above insulative material 55 that is directly above the top of stack 18. Silicon-containing material 57 comprises at least 30 atomic percent of at least one of elemental-form silicon or a silicon-containing alloy (e.g., Si—Ge). In one embodiment, silicon-containing material 57 comprises at least 40 atomic percent of the at least one of elemental-form silicon or a silicon-containing alloy. In one embodiment, silicon-containing material 57 predominately comprises undoped elemental-form silicon, and in another embodiment predominately comprises doped elemental-form silicon. In this document, "doped" and "undoped" are with reference to conductivity-modifying impurity present within silicon-containing material 57, with "undoped" defining from 0 atomic percent to less than 4.0 atomic percent conductivity-modifying dopant therein and "doped" meaning at least 4.0 atomic percent up to and including 57.7 atomic percent conductivity-modifying impurity therein.

Regardless, in one embodiment silicon-containing material 57 comprises polycrystalline elemental-form silicon as initially-formed. In one embodiment, silicon-containing material 57 comprises amorphous elemental-form silicon at least as initially formed, and in one such embodiment in a finished construction and in another such embodiment comprises transforming the amorphous elemental-form silicon to be polycrystalline in a finished construction. In the context of this document, a material is "amorphous" if at least 90% thereof by volume is of the amorphous phase and a material is polycrystalline if at least 90% thereof by volume is of a polycrystalline phase.

In one embodiment, silicon-containing material 57 comprises a silicon-containing alloy.

Silicon-containing material 57 may be formed by any suitable existing or yet-to-be-developed technique, with low pressure CVD being but one example. Example conditions for forming silicon-containing material 57 include a temperature of 475° C. to 650° C., pressure of 500 to 900 mTorr, and a precursor feed rate (e.g., a silane) of 1 to 2 slm. Deposition of elemental-form silicon under such conditions at temperatures below about 550° C. will result in an amorphous deposition whereas at temperatures above about 550° C. will result in a polycrystalline deposition. Where desired, an amorphous silicon-containing material 57 may be transformed to be polycrystalline by exposure to temperature above 550° C. for a sufficient period of time that typically decreases the greater the temperature is above 550° C.

Figure 15:
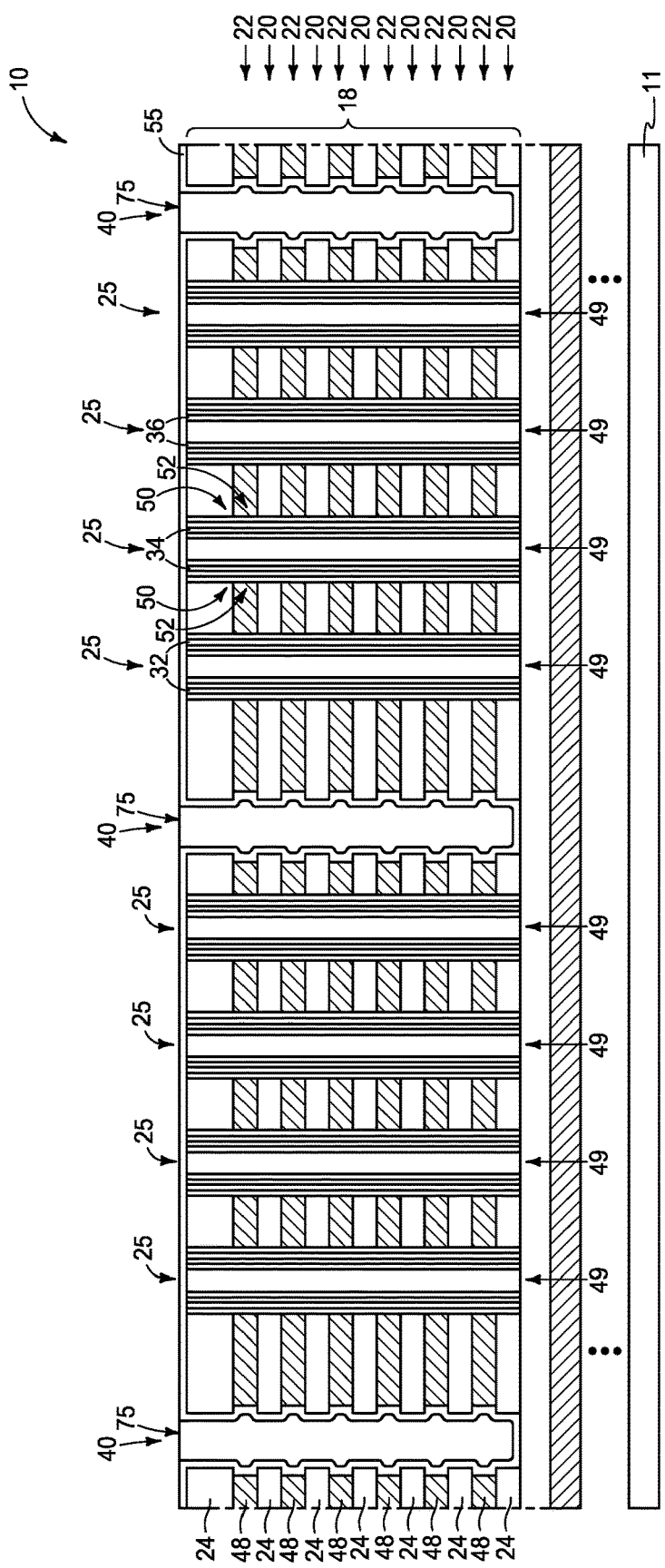
FIG. 15 is a view of the FIG. 14 substrate at a processing step subsequent to that shown by FIG. 14.

Referring to FIG. 15, and in one embodiment, silicon-containing material 57 has been removed selectively relative to insulative material of lining 55 that is directly above the top of stack 18 and to expose insulative material of lining 55 that is directly above the top of stack 18. Silicon-containing material 57, by way of example, may be removed by polishing, etch-back, and/or selective etching relative to insulative material of lining 55. Regardless, FIG. 15 may be considered as showing formation of elevationally-extending walls 75 that comprise laterally-outer insulative material 55 and silicon-containing material 57 spanning laterally-between insulative material 55.

Figure 16:
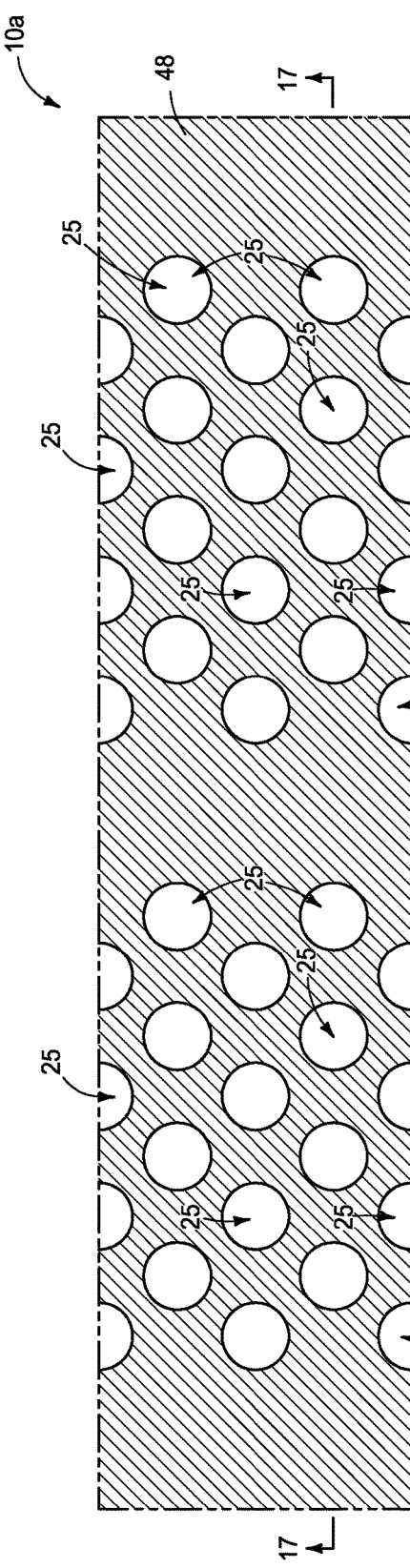
FIG. 16 is a diagrammatic cross-sectional view of a portion of a substrate in process in accordance with an embodiment of the invention and is taken through line 16-16 in FIG. 17.
Figure 17:
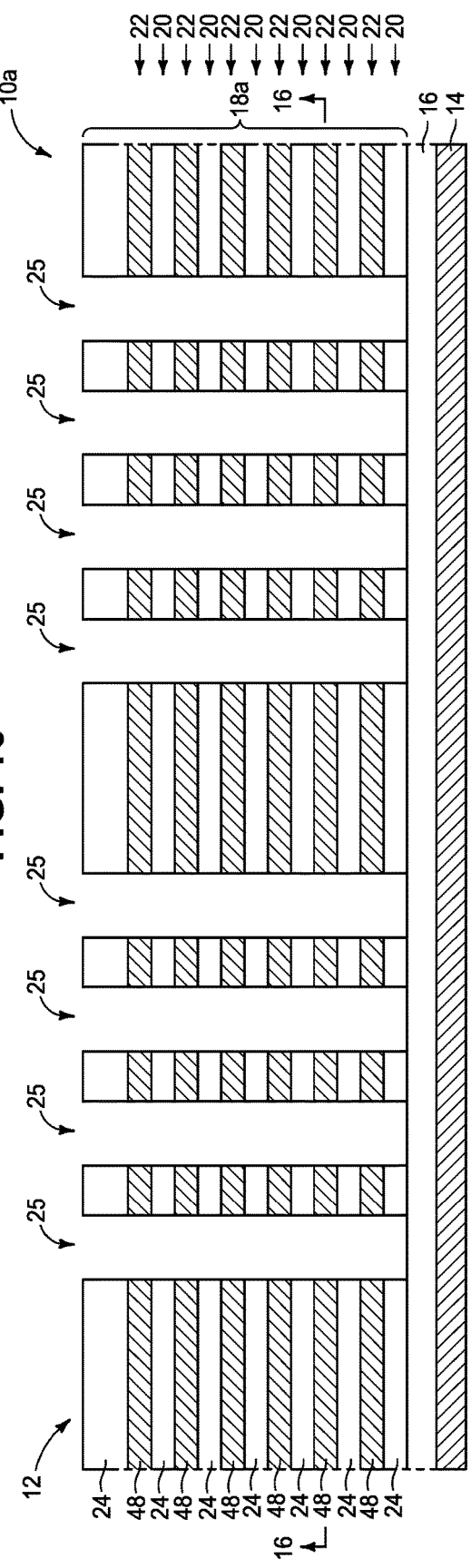
FIG. 17 is a view taken through line 17-17 in FIG. 16.

Another example embodiment method of forming an array of elevationally-extending strings of memory cells is next-described with reference to FIGS. 16-22, and which may be considered as gate-first processing. Like numerals from the above-described embodiments have been used where appropriate, with some construction differences being indicated with the suffix "a" or with different numerals. Referring to FIGS. 16 and 17, stack 18*a* comprising vertically-alternating insulative tiers 20 and wordline tiers 22 has been formed directly above conductively-doped semiconductor material 16. Wordline tiers 22 comprise control-gate material 48. Elevationally-extending channel openings 25 have been formed into alternating tiers 20, 22.

Figure 18:
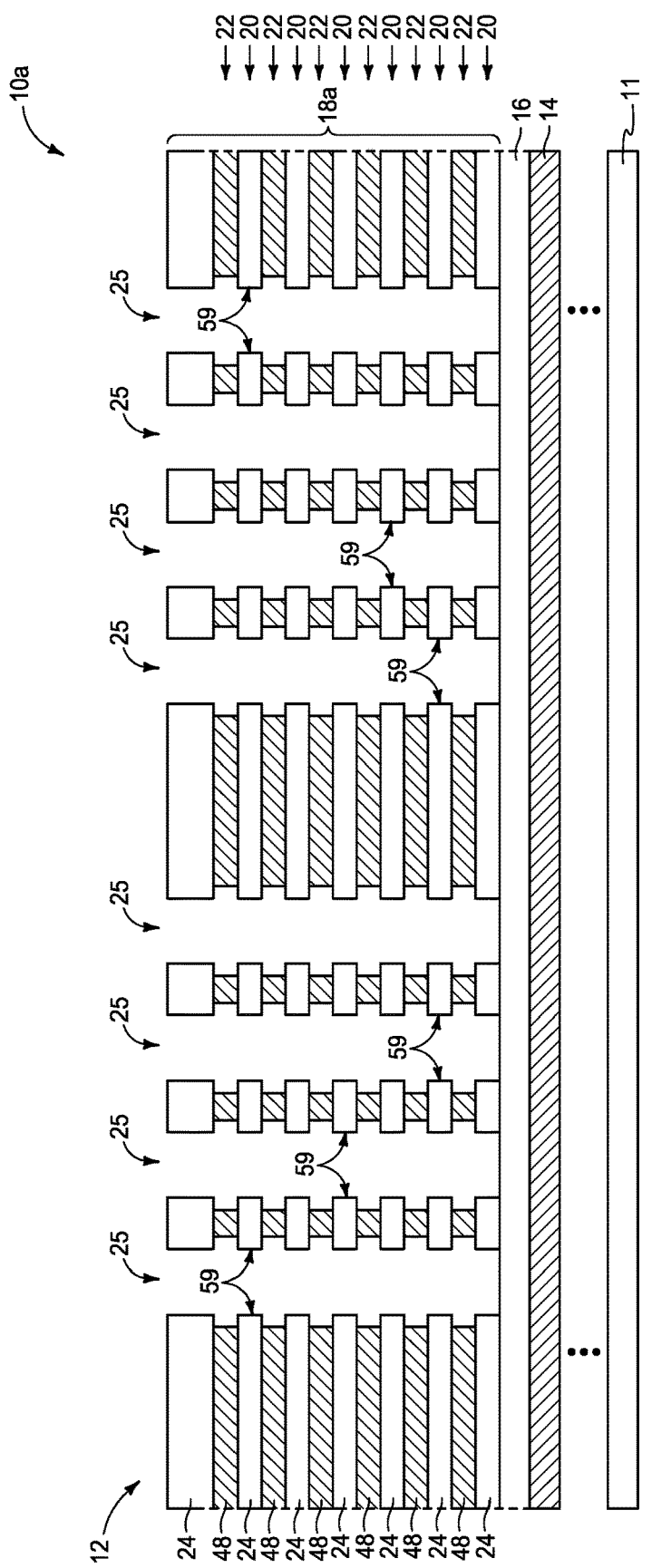
FIG. 18 is a view of the FIG. 17 substrate at a processing step subsequent to that shown by FIG. 17.

Referring to FIG. 18, and in one embodiment, control-gate material 48 has been laterally-recessed (e.g., by selective etching) relative to radially-innermost sidewalls 59 of channel openings 25.

Figure 19:
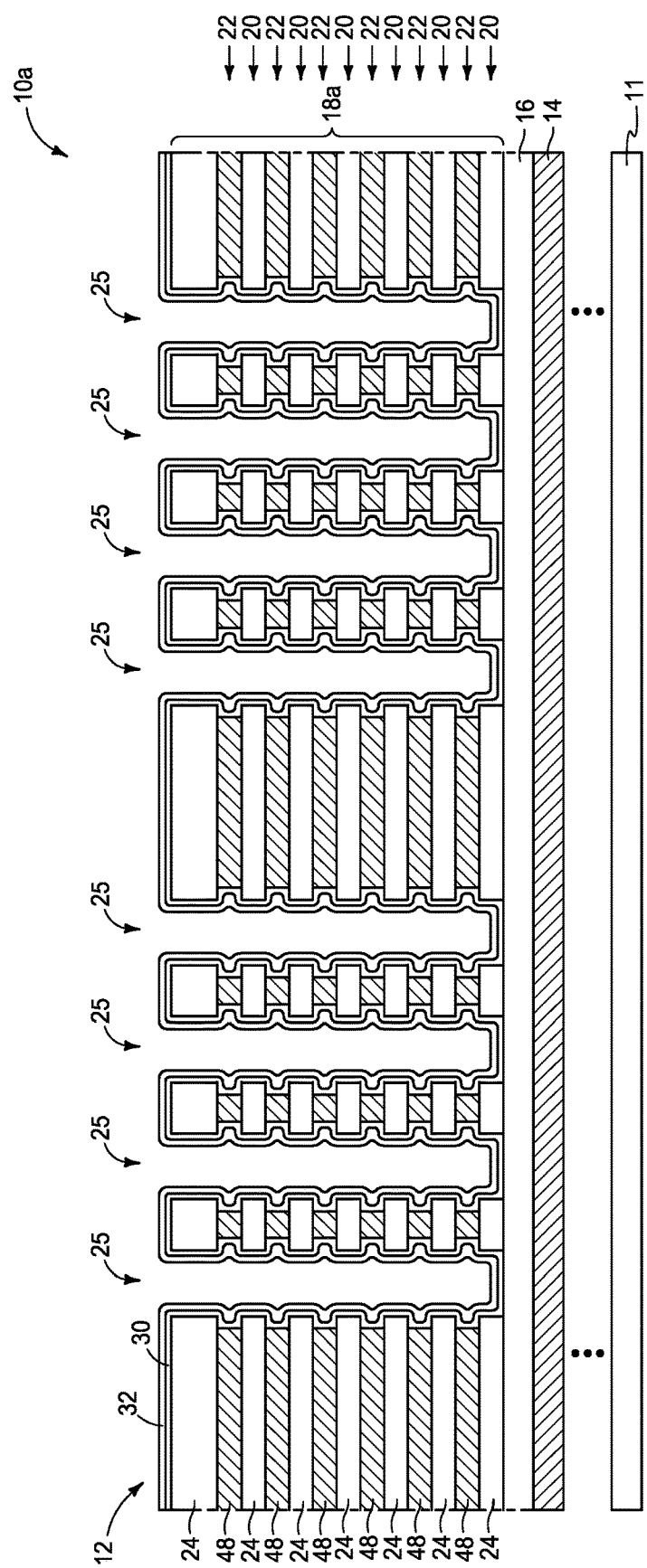
FIG. 19 is a view of the FIG. 18 substrate at a processing step subsequent to that shown by FIG. 18.

Referring to FIG. 19, charge-blocking material 30 and then charge-storage material 32 have been formed in channel openings 25 elevationally along alternating tiers 20, 22.

Figure 20:
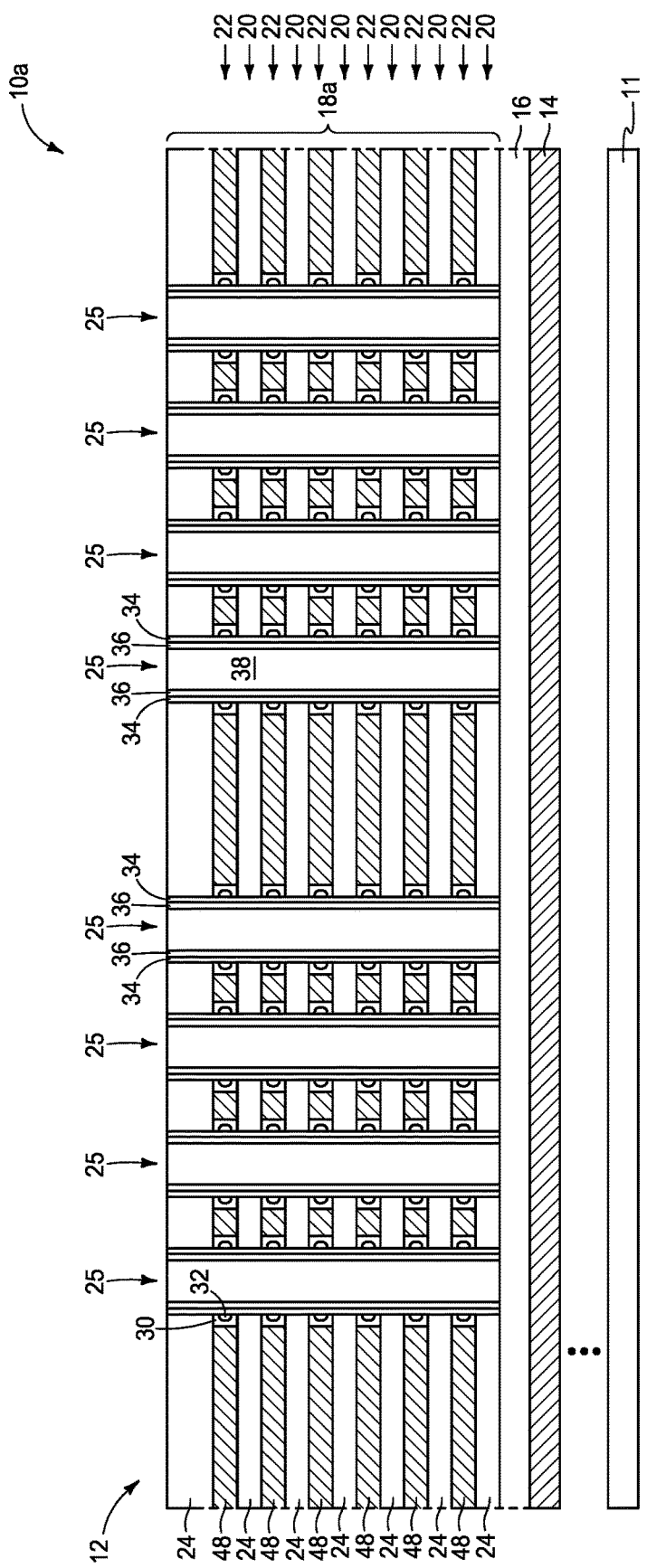
FIG. 20 is a view of the FIG. 19 substrate at a processing step subsequent to that shown by FIG. 19.

Referring to FIG. 20, insulative charge-passage material 34, then transistor channel material 36, and then radially-central dielectric material 38 have been formed in channel openings 25. Materials 24, 36, and 38 may be deposited as conformal layers which are collectively planarized back after depositing all three to produce the example construction as shown in FIG. 20.

Figure 21:
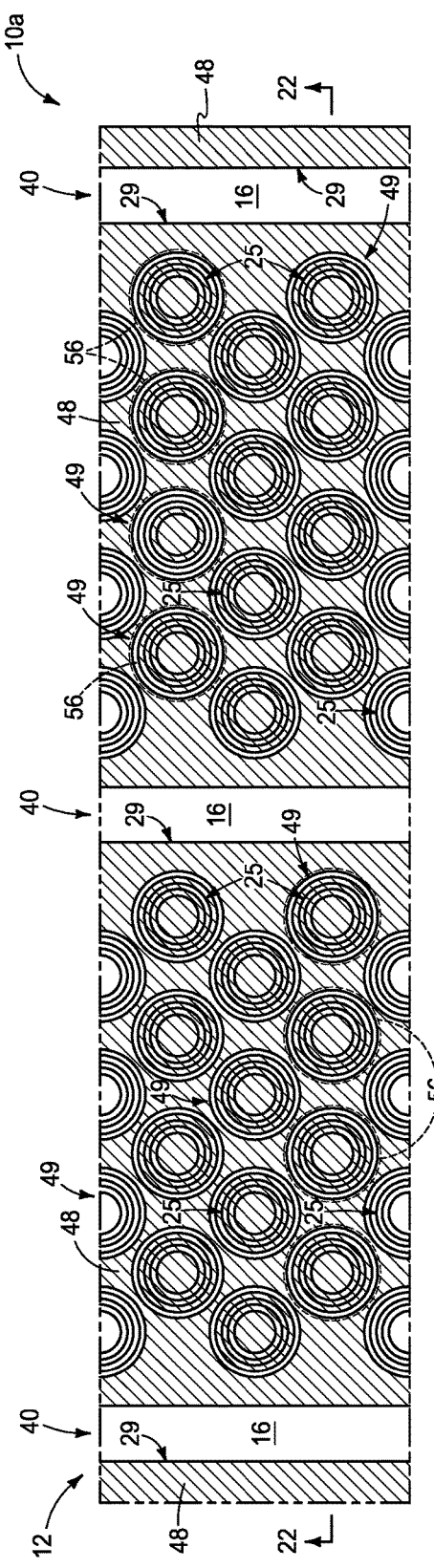
FIG. 21 is a view of the FIG. 20 substrate at a processing step subsequent to that shown by FIG. 20 and is taken through line 21-21 in FIG. 22.
Figure 22:
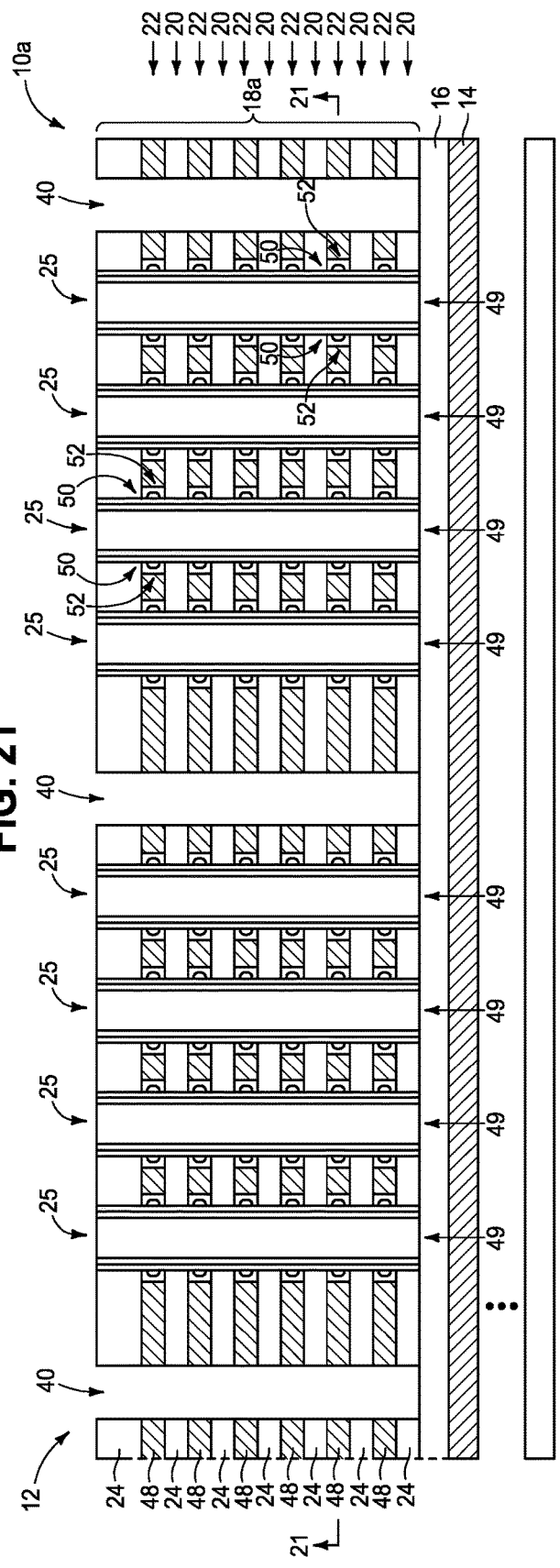
FIG. 22 is a view taken through line 22-22 in FIG. 21.

Referring to FIGS. 21 and 22, trenches 40 have been formed through stack 18a to conductively-doped semiconductor material 16 (i.e., at least thereto), and which forms wordlines 29. Control-gate material 48 is provided to have terminal ends 50 corresponding to control-gate regions 52 of individual memory cells 56 and a charge-blocking region (e.g., material 30) is between charge-storage material (e.g., material 32) and individual of control-gate regions 52. Subsequent and/or alternate processing may then occur as described above with respect to FIGS. 12-15. Any other attribute(s) or aspect(s) as shown and/or described herein with respect to other embodiments may be used.

An embodiment of the invention comprises a method of forming an array (e.g., 12) of elevationally-extending strings (e.g., 49) of memory cells (e.g., 56) regardless of whether gate-first, gate-last, or otherwise. A stack (e.g., 18, 18a) is formed that comprises vertically-alternating insulative tiers (e.g., 20) and wordline tiers (e.g., 22). Horizontally-elongated trenches (e.g., 40) are formed through the stack to the conductively-doped semiconductor material. An insulative-material lining (e.g., 55) is formed in individual of the trenches over and elevationally along sidewalls of the individual trenches. Silicon-containing material (e.g., 57) is formed in the individual trenches elevationally along and spanning laterally between the insulative-material lining. The silicon-containing material comprises at least 30 atomic percent of at least one of elemental-form silicon or a silicon-containing alloy. Transistor channel material (e.g., 36) is provided to extend elevationally along the alternating tiers. In one embodiment, such is formed by first forming elevationally-extending channel openings (e.g., 25) into the stack and into which the transistor channel material is provided. In one such embodiment, the channel openings are formed before forming the trenches, and yet in another such embodiment are formed after forming the trenches. Regardless, the wordline tiers are formed to comprise control-gate material (e.g., 48) having terminal ends (e.g., 50) corresponding to control-gate regions (e.g., 52) of individual memory cells (e.g., 56). Charge-storage material (e.g., 32) is provided between the transistor channel material and the control-gate regions. Insulative charge-passage material (e.g., 34) is provided between the transistor channel material and the charge-storage material. A charge-blocking region (e.g., 30) is provided between the charge-storage material and individual of the control-gate regions. In one embodiment, the control-gate material is provided before forming the trenches and in another embodiment the control-gate material is provided after forming the trenches. Any other attribute(s) or aspect(s) as shown and/or described herein with respect to other embodiments may be used.

An embodiment of the invention comprises an array (e.g., 12) of elevationally-extending strings (e.g., 49) of memory cells (e.g., 56). The array comprises a vertical stack (e.g., 18, 18a) of alternating insulative tiers (e.g., 20) and wordline tiers (e.g., 22). The wordline tiers have terminal ends (e.g., 50) corresponding to control-gate regions (e.g., 52) of individual memory cells (e.g., 56). The control-gate regions individually comprise part of a wordline (e.g., 29) in individual of the wordline tiers. A charge-blocking region (e.g., 30) of the individual memory cells extends elevationally along the individual control-gate regions. Charge-storage material (e.g., 32) of the individual memory cells extends elevationally along individual of the charge-blocking regions. Channel material (e.g., 36) extends elevationally along the vertical stack. Insulative charge-passage material (e.g., 34) is laterally between the channel material and the charge-storage material. Elevationally-extending walls (e.g., 75) laterally separate immediately-laterally-adjacent of the wordlines. The walls comprise laterally-outer insulative material (e.g., 55) and silicon-containing material (e.g., 57) spanning laterally between the laterally-outer insulative material. The silicon-containing material comprises at least 30 atomic percent of at least one of elemental-form silicon or silicon-containing alloy. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, forming, and/or formation is such an act of one stated material relative to another stated material(s) so acted upon at a rate of at least 2:1 by volume.

CONCLUSION

In some embodiments, a method of forming an array of elevationally-extending strings of memory cells comprises forming a stack comprising vertically-alternating insulative tiers and wordline tiers. Horizontally-elongated trenches are formed into the stack. An insulative-material lining is formed in individual of the trenches over and elevationally along sidewalls of the individual trenches. Silicon-containing material is formed in the individual trenches elevationally along and spanning laterally between the insulative-material lining. The silicon-containing material comprises at least 30 atomic percent of at least one of elemental-form silicon or a silicon-containing alloy. Elevationally-extending strings of transistor channel material are provided elevationally along the alternating tiers and laterally spaced from the insulative-material linings. The wordline tiers are provided to comprise control-gate material having terminal ends corresponding to control-gate regions of individual memory cells. Charge-storage material is provided between the transistor channel material and the control-gate regions. Insulative charge-passage material is provided between the transistor channel material and the charge-storage material. A charge-blocking region is provided between the charge-storage material and individual of the control-gate regions.

In some embodiments, a method of forming an array of elevationally-extending strings of memory cells comprises forming a stack comprising vertically-alternating insulative tiers and wordline tiers directly above control circuitry under the stack that in a finished construction controls read and write access to the elevationally-extending strings of memory cells. The insulative tiers comprise insulative first material. The wordline tiers comprise second material that is of different composition from that of the first material. Elevationally-extending channel openings are formed into the alternating tiers. Charge-storage material is formed in the channel openings elevationally along the alternating tiers. Insulative charge-passage material is formed in the channel openings elevationally along the alternating tiers and the charge-storage material. Transistor channel material is formed in the channel openings elevationally along the alternating tiers and the insulative charge-passage material. Horizontally-elongated trenches are formed into the stack. The trenches individually have a lateral mid-portion. The second material of the wordline tiers is etched selectively relative to the insulative first material. Control-gate material is formed into the wordline tiers through the trenches to be elevationally between the insulative first material of the alternating tiers and to be in the lateral mid-portion of individual of the trenches. The control-gate material has terminal ends corresponding to control-gate regions of individual memory cells. A charge-blocking region is provided between the charge-storage material and individual of the control-gate regions. The control gate material is removed from the lateral mid-portions of the individual trenches. After the removing, an insulative-material lining is formed in the individual trenches over and elevationally along sidewalls of the individual trenches. Silicon-containing material is formed in the individual trenches elevationally along and spanning laterally between the insulative-material lining. The silicon-containing material comprises at least 30 atomic percent of at least one of elemental-form silicon or a silicon-containing alloy.

In some embodiments, an array of elevationally-extending strings of memory cells comprises a vertical stack of alternating insulative tiers and wordline tiers. The wordline tiers have terminal ends corresponding to control-gate regions of individual memory cells. The control-gate regions individually comprise part of a wordline in individual of the wordline tiers. A charge-blocking region of the individual memory cells extends elevationally along the individual control-gate regions. Charge-storage material of the individual memory cells extends elevationally along individual of the charge-blocking regions. Channel material extends elevationally along the vertical stack. Insulative charge-passage material is laterally between the channel material and the charge-storage material. Elevationally-extending walls laterally separate immediately-laterally-adjacent of the wordlines. The walls comprise laterally-outer insulative-material and silicon-containing material spanning laterally between the laterally-outer insulative material. The silicon-containing material comprises at least 30 atomic percent of at least one of elemental-form silicon or a silicon-containing alloy.

In some embodiments, an array of elevationally-extending strings of memory cells comprises control circuitry that controls read and write access to the elevationally-extending strings of memory cells. A vertical stack of alternating insulative tiers and wordline tiers is directly above the control circuitry. The wordline tiers have terminal ends corresponding to control-gate regions of individual memory cells. The control-gate regions individually comprise part of a wordline in individual of the wordline tiers. A charge-blocking region of the individual memory cells extends elevationally along the individual control-gate regions. Charge-storage material of the individual memory cells extends elevationally along individual of the charge-blocking regions. Channel material extends elevationally along the vertical stack. Insulative charge-passage material is laterally between the channel material and the charge-storage material. Elevationally-extending walls laterally separate immediately-laterally-adjacent of the wordlines. The walls comprise laterally-outer insulative material and polysilicon spanning laterally between the laterally-outer insulative material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of elevationally-extending strings of memory cells, the method comprising:
   forming a stack comprising vertically-alternating insulative tiers and wordline tiers;
   forming horizontally-elongated trenches into the stack;
   forming an insulative-material lining in individual of the trenches over and elevationally along sidewalls of the individual trenches;
   forming silicon-containing material in the individual trenches elevationally along and spanning laterally between the insulative-material lining, the silicon-containing material comprising at least 30 atomic percent of at least one of elemental-form silicon or a silicon-containing alloy;
   providing elevationally-extending strings of transistor channel material elevationally along the alternating tiers and laterally spaced from the insulative-material linings; and
   providing the wordline tiers to comprise control-gate material having terminal ends corresponding to control-gate regions of individual memory cells, charge-storage material between the transistor channel material and the control-gate regions, insulative charge-passage material between the transistor channel material and the charge-storage material, and a charge-blocking region between the charge-storage material and individual of the control-gate regions.

2. The method of claim 1 wherein the insulative material predominately comprises $SiO_2$.

3. The method of claim 1 wherein the insulative material comprises at least one of silicon nitride, silicon oxynitride, aluminum oxide, and hafnium oxide.

4. The method of claim 1 wherein the insulative material is ferroelectric.

5. The method of claim 1 wherein the silicon-containing material comprises at least 40 atomic percent of the at least one of elemental-form silicon or a silicon-containing alloy.

6. The method of claim 1 wherein the silicon-containing material predominately comprises undoped elemental-form silicon.

7. The method of claim 1 wherein the silicon-containing material predominately comprises doped elemental-form silicon.

8. The method of claim 1 wherein the silicon-containing material comprises polycrystalline elemental-form silicon as initially-formed.

9. The method of claim 1 wherein the silicon-containing material comprises amorphous elemental-form silicon at least as initially formed.

10. The method of claim 9 wherein the silicon-containing material comprises amorphous elemental-form silicon in a finished construction.

11. The method of claim 9 comprising transforming the amorphous elemental-form silicon to be polycrystalline in a finished construction.

12. The method of claim 1 wherein the silicon-containing material comprises a silicon-containing alloy.

13. The method of claim 1 comprising forming the individual trenches to have an uppermost minimum lateral width in a vertical cross-section, the insulative-material lining having a lateral width of 2.5% to 20% of the uppermost minimum lateral width in the vertical cross-section.

14. The method of claim 13 comprising forming the insulative-material lining to have a lateral width of 5% to 12.5% of the uppermost minimum lateral width in the vertical cross-section.

15. The method of claim 14 comprising forming the insulative-material lining to have a lateral width of about 10% of the uppermost minimum lateral width in the vertical cross-section.

16. The method of claim 1 comprising forming the insulative-material lining by atomic layer deposition.

17. The method of claim 1 comprising forming the insulative-material lining by chemical vapor deposition.

18. The method of claim 1 comprising forming elevationally-extending channel openings into the stack and into which the transistor channel material is provided, the channel openings being formed and the transistor channel material being provided before forming the trenches.

19. The method of claim 1 comprising providing the control-gate material before forming the trenches.

20. The method of claim 1 comprising providing the control-gate material after forming the trenches.

21. The method of claim 1 comprising:
   forming the insulative material directly above a top of the stack;
   forming the silicon-containing material directly above the top of the stack directly above the insulative material that is directly above the top of the stack; and removing the silicon-containing material selectively relative to the insulative material that is directly above the top of the stack and to expose the insulative material that is directly above the top of the stack.

22. A method of forming an array of elevationally-extending strings of memory cells, the method comprising:
forming a stack comprising vertically-alternating insulative tiers and wordline tiers directly above control circuitry under the stack that in a finished construction controls read and write access to the elevationally-extending strings of memory cells, the insulative tiers comprising insulative first material, the wordline tiers comprising second material that is of different composition from that of the first material;
forming elevationally-extending channel openings into the alternating tiers;
forming charge-storage material in the channel openings elevationally along the alternating tiers;
forming insulative charge-passage material in the channel openings elevationally along the alternating tiers and the charge-storage material;
forming transistor channel material in the channel openings elevationally along the alternating tiers and the insulative charge-passage material;
forming horizontally-elongated trenches into the stack, the trenches individually having a lateral mid-portion;
etching the second material of the wordline tiers selectively relative to the insulative first material;
forming control-gate material into the wordline tiers through the trenches to be elevationally between the insulative first material of the alternating tiers and to be in the lateral mid-portion of individual of the trenches, the control-gate material having terminal ends corresponding to control-gate regions of individual memory cells, providing a charge-blocking region between the charge-storage material and individual of the control-gate regions;
removing the control gate material from the lateral mid-portions of the individual trenches;
after the removing, forming an insulative-material lining in the individual trenches over and elevationally along sidewalls of the individual trenches; and
forming silicon-containing material in the individual trenches elevationally along and spanning laterally between the insulative-material lining, the silicon-containing material comprising at least 30 atomic percent of at least one of elemental-form silicon or a silicon-containing alloy.

* * * * *